(12) United States Patent
Luan (10) Patent No.: US 10,269,583 B2
(45) Date of Patent: Apr. 23, 2019

(54) SEMICONDUCTOR DIE ATTACHMENT WITH EMBEDDED STUD BUMPS IN ATTACHMENT MATERIAL

(71) Applicant: STMICROELECTRONICS PTE LTD, Singapore (SG)

(72) Inventor: Jing-En Luan, Shenzhen (CN)

(73) Assignee: STMicroelectronics Pte Ltd, Singapore (SG)

(*) Notice: Subject to any disclaimer, the term of this patent is extended or adjusted under 35 U.S.C. 154(b) by 0 days.

(21) Appl. No.: 14/981,338

(22) Filed: Dec. 28, 2015

(65) Prior Publication Data

US 2017/0053856 A1 Feb. 23, 2017

(30) Foreign Application Priority Data

Aug. 21, 2015 (CN) .......................... 2015 1 0518731

(51) Int. Cl.
*H01L 23/495* (2006.01)
*H01L 25/00* (2006.01)
(Continued)

(52) U.S. Cl.
CPC ...... *H01L 21/4853* (2013.01); *H01L 23/3107* (2013.01); *H01L 23/49513* (2013.01); *H01L 24/73* (2013.01); *H01L 25/0657* (2013.01); *H01L 25/50* (2013.01); *H01L 23/293* (2013.01); *H01L 23/3121* (2013.01); *H01L 2224/0401* (2013.01); *H01L 2224/04026* (2013.01); *H01L 2224/04042* (2013.01); *H01L 2224/16145* (2013.01); *H01L 2224/16227* (2013.01); *H01L 2224/16245* (2013.01); *H01L 2224/32145* (2013.01); *H01L 2224/32225* (2013.01); *H01L 2224/32245* (2013.01); *H01L 2224/48145* (2013.01); *H01L 2224/48227* (2013.01); *H01L 2224/73204* (2013.01); *H01L 2224/73257* (2013.01); *H01L 2224/73265* (2013.01);
(Continued)

(58) Field of Classification Search
CPC ........... H01L 23/49575; H01L 23/3121; H01L 23/293; H01L 23/4951; H01L 25/0657; H01L 25/50; H01L 21/4853; H01L 2924/01079; H01L 2225/06513; H01L 2225/06524
USPC ...................................................... 257/777
See application file for complete search history.

(56) References Cited

U.S. PATENT DOCUMENTS 8,394,713 B2 3/2013 Mathew
2002/0013015 A1* 1/2002 Kado ................ H01L 23/49838
438/107
(Continued)

FOREIGN PATENT DOCUMENTS

CN 101345199 A 1/2009
CN 102754203 A 10/2012
CN 104425429 A 3/2015

*Primary Examiner* — Changhyun Yi
(74) *Attorney, Agent, or Firm* — Seed Intellectual Property Law Group LLP (57) ABSTRACT

The embodiments of the present disclosure relate to a semiconductor device and a manufacturing method therefor. The semiconductor device comprises: a die attachment pad; a stud bump located on the die attachment pad and in direct contact with the die attachment pad; a first die located on the stud bump and electrically coupled to the stud bump; and a conductive attachment material located between the die attachment pad and the first die.

20 Claims, 4 Drawing Sheets

(51) Int. Cl.
    *H01L 21/48*     (2006.01)
    *H01L 23/00*     (2006.01)
    *H01L 23/31*     (2006.01)
    *H01L 25/065*     (2006.01)
    *H01L 23/29*     (2006.01)

(52) U.S. Cl.
    CPC ........... *H01L 2225/0651* (2013.01); *H01L 2225/06506* (2013.01); *H01L 2225/06513* (2013.01)

(56) References Cited

U.S. PATENT DOCUMENTS

| | | | |
|---|---|---|---|
| 2003/0009876 A1* | 1/2003 | Yamauchi | H01L 21/563 29/832 |
| 2004/0080055 A1* | 4/2004 | Jiang | H01L 21/563 257/783 |
| 2005/0082656 A1* | 4/2005 | Chu | H01L 25/0657 257/686 |
| 2009/0321118 A1* | 12/2009 | Kim | H01L 23/5389 174/260 |
| 2011/0042798 A1* | 2/2011 | Pagaila | H01L 21/568 257/692 |
| 2011/0169159 A1* | 7/2011 | Lin | H01L 21/481 257/692 |
| 2011/0187005 A1* | 8/2011 | Pagaila | H01L 25/0657 257/777 |
| 2014/0291834 A1* | 10/2014 | Gandhi | H01L 24/81 257/737 |
| 2015/0223338 A1* | 8/2015 | Noda | H01L 23/5383 361/771 |
| 2016/0218049 A1* | 7/2016 | Lin | H01L 24/97 |

\* cited by examiner

SEMICONDUCTOR DIE ATTACHMENT WITH EMBEDDED STUD BUMPS IN ATTACHMENT MATERIAL

BACKGROUND

Technical Field

The present disclosure relates to the technical field of semiconductors, and more particularly, to a semiconductor device and a manufacturing method therefor.

Description of the Related Art

In a stacked semiconductor device, interconnections are typically desired between stacked semiconductor devices to implement the transmission of electrical signals. The semiconductor devices typically implement connections between circuits using metal joining pads, wherein generally the principal metal suitable for the joining pads is aluminum and may continue to be aluminum, due to the reliable deposition and patterning characteristics thereof. However, compared to other metal (such as copper), aluminum has a relatively high resistivity and is easily oxidized in the manufacturing process, which then results in unstable resistance at joints and may even result in intermittent faults.

Some techniques have been proposed for substitution, for example, the over pad metallization technique, which generally uses noble metal, such as palladium, nickel and gold, and this causes the manufacturing cost of the semiconductor device to soar.

BRIEF SUMMARY

According to a first aspect of the present disclosure, a semiconductor device is provided, comprising: a die attachment pad; a stud bump located on the die attachment pad and in direct contact with the die attachment pad; a first die located on the stud bump and electrically coupled to the stud bump; and a conductive attachment material located between the die attachment pad and the first die.

Optionally, the semiconductor device further comprises: a substrate, wherein the die attachment pad is located on the substrate.

Optionally, the semiconductor device further comprises: a second die, wherein the die attachment pad is located on the second die and electrically coupled to the second die.

Optionally, the semiconductor device further comprises: a substrate, wherein the second die is located on the substrate.

Optionally, the semiconductor device further comprises: resin, wherein the resin encapsulates the first die, the conductive attachment material and the substrate, or encapsulates the first die, the second die, the conductive attachment material and the substrate.

Optionally, the semiconductor device further comprises: a lead frame, wherein the die attachment pad is coupled to the lead frame.

Optionally, the semiconductor device further comprises: resin, wherein the resin encapsulates the first die, the conductive attachment material and the lead frame.

Optionally, the direct contact between the stud bump and the die attachment pad is implemented by means of ultrasound processing.

According to another aspect of the present disclosure, an electronic apparatus is provided, comprising the semiconductor device as described in any one of the above.

According to a further aspect of the present disclosure, a method for manufacturing a semiconductor device is provided, comprising: providing a die attachment pad; providing a stud bump on the die attachment pad, such that the die attachment pad is in direct contact with the stud bump; providing a conductive attachment material on the die attachment pad; and providing a first die on the stud bump and the conductive attachment material.

Optionally, providing the die attachment pad comprises: providing the die attachment pad on a substrate.

Optionally, providing the die attachment pad comprises: providing the die attachment pad on a second die, such that the die attachment pad is electrically coupled to the second die.

Optionally, the method further comprises: providing a substrate, such that the second die is located on the substrate.

Optionally, the method further comprises: encapsulating the first die, the conductive attachment material and the substrate, or encapsulating the first die, the second die, the conductive attachment material and the substrate using resin.

Optionally, the method further comprises: providing a lead frame, such that the die attachment pad is coupled to the lead frame.

Optionally, the method further comprises: encapsulating the first die, the conductive attachment material and the lead frame using resin.

Optionally, the semiconductor device is processed using ultrasound, such that at least a portion of a metal oxide layer on a surface of the die attachment pad is removed so as to implement the direct contact between the die attachment pad and the stud bump.

By using the method for manufacturing a semiconductor device according to an embodiment of the present disclosure, the manufacturing cost is significantly reduced.

BRIEF DESCRIPTION OF THE SEVERAL VIEWS OF THE DRAWINGS

The foregoing and other objectives, features and advantages of the present disclosure will become more apparent from the more detailed description of the exemplary embodiments of the present disclosure in conjunction with the accompanying drawings. In the exemplary embodiments of the present disclosure, like reference numbers generally represent like components.

DETAILED DESCRIPTION

In the following description, certain particular details are set forth in order to provide a thorough understanding of various aspects of the disclosed subject matter. However, the disclosed subject matter can also be implemented without these particular details.

Unless otherwise required in the context, the term "comprise" appearing in the whole text of the description and the appended claims will be interpreted as open inclusion, i.e., interpreted as "including, but not limited to."

Reference throughout this description to "one embodiment," or "an embodiment" means that a specific feature, structure or characteristic described in connection with the embodiment is included in at least one embodiment. Therefore, the expressions "in one embodiment" or "in an embodiment" appearing in various parts throughout the whole text of the present description do not necessarily refer to the same aspect. Furthermore, the specific features, structures, or characteristics can be combined in any suitable manner in one or more aspects of the present disclosure.

Figure 1:
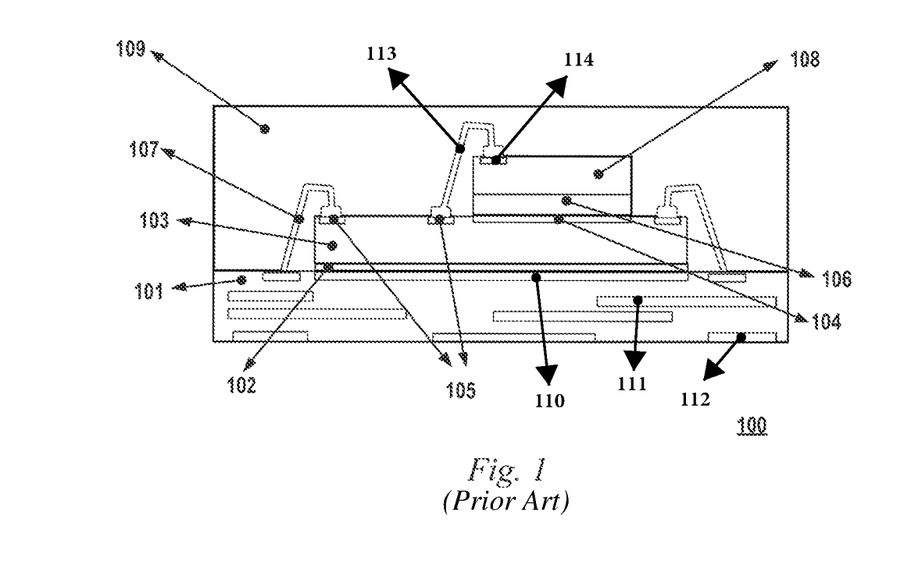
FIG. 1 is a schematic diagram of a conventional stacked semiconductor device.

Reference is made to FIG. 1. FIG. 1 shows a schematic diagram of a conventional stacked semiconductor device 100. In the semiconductor device 100 there is a substrate 101 or lead frame (See FIG. 4), wherein the substrate 101 may be a printed circuit board, a flat plate which is made from materials such as glass, ceramic and metal, such as layers 110, 111, and 112, for supporting and/or transmitting electrical signals. Optionally, the substrate material has a good heat-conductive performance, such that the heat generated in the chip is conducted to the external environment/apparatus. On the substrate 101, a bottom die 103, in which a circuit is integrated, is attached to the substrate 101 by means of a die attachment material 102. The die attachment material is a material such as solder, adhesive or a conductive glue, and can be conductive or nonconductive according to preferred specifications. In the example of FIG. 1, an upper surface of the bottom chip 103 has bond pads 105 and a top attachment pad 104. In FIG. 1, the bond pads 105 are bonded to the substrate or leads of the lead frame 101 via wires 107. A top die 108 is attached to the die attachment pad 104 on the top surface of the bottom chip 103 via a top pad attachment material 106. Since there is a desire to transmit electrical signals or power between the top chip and the bottom chip, the attachment material 106 is conductive, such as conductive soldering, a conductive adhesive or a conductive glue, and the like. There is also a bond pad 114 on an upper surface of the top chip 108, wherein this bond pad is also bonded to a pad on the bottom chip 103 via a wire 113.

In the actual manufacturing process, aluminum is generally used to fabricate the top attachment pad 104, but the surface of the aluminum pad is easily oxidized to form an aluminum oxide film. Due to the insulativity of aluminum oxide, this easily results in unstable joining resistance and electrical performance faults. An existing technical solution for example uses an over pad metallization technical solution. Reference is made to Chinese Patent Application CN102754203, which also published as U.S. Pat. No. 8,394,713, which discloses a joining pad with multi-layer over pad metallization and a method of formation. This method generally uses noble metals like palladium and nickel to perform metallization, and utilizes a plurality of masks to perform patterning, which causes the manufacturing cost of the semiconductor device to sharply increase.

Figure 2:
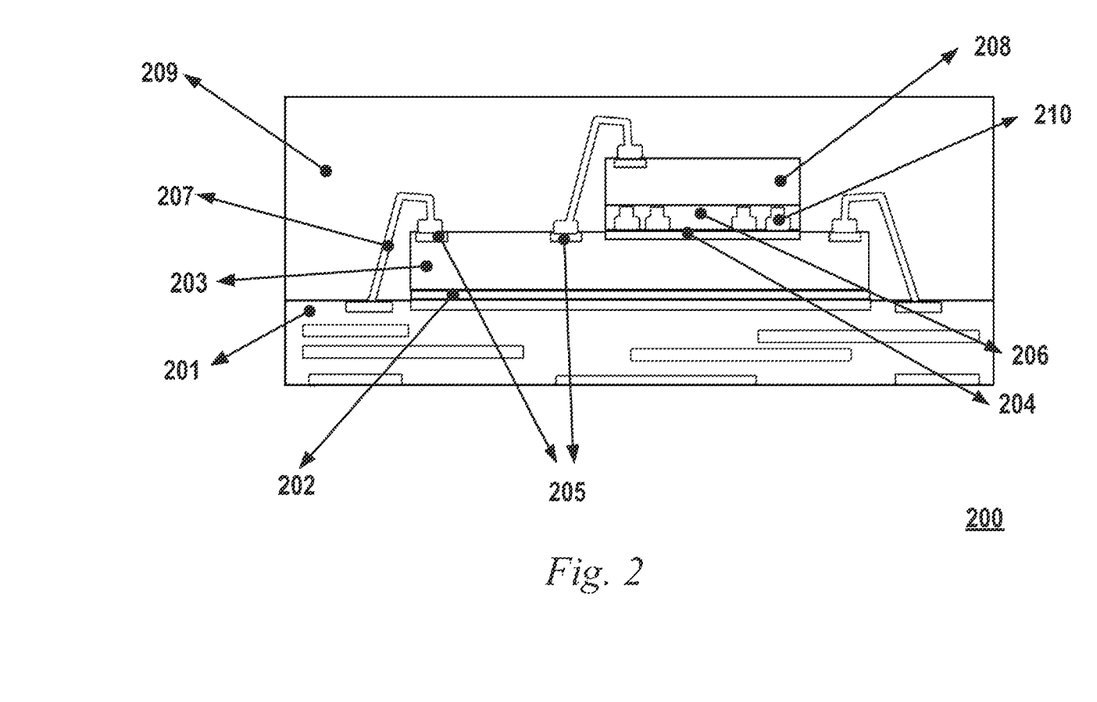
FIG. 2 is a schematic diagram of a semiconductor device according to one embodiment of the present disclosure.

The embodiments of the present disclosure envisage a new technical solution to solve the technical problem. Reference is made to FIG. 2 which shows a semiconductor device according to one embodiment of the present disclosure. Like reference numerals refer to like components in FIG. 2 and FIG. 1, but are in the 200 series, rather than the 100 series, and will not be described again in the interest of brevity. In the embodiment of FIG. 2, a bottom die 203 is joined to a substrate 201 or lead frame (404 in FIG. 4) by means of a die joining material 202 and is electrically coupled to the substrate 201 by means of wires 207. There are bond pads 205 and an attachment pad 204 on the upper surface of the bottom die 203. Stud bumps 210 are provided on the attachment pad 204. The stud bumps 210 are rigid bodies made of a conductive material. In some embodiments, the conductive material is a metal material, such as gold. In the Figure, four stud bumps are shown, but it can be appreciated that there may be one or more other stud bumps. Preferably, in order to keep a top die stable, a plurality of stud bumps are provided, for example, three or four stud bumps are provided. The stud bumps 210 are in direct contact with the attachment pad 204. Surrounding the stud bumps 210 is a die attachment material 206. The top die 208 is located on the stud bumps 210 and the die attachment material 206 and is electrically coupled to the stud bumps 210 and the die attachment material 206. The stud bumps are made from an electrically conductive material, which may be metal, such as gold. In addition, the top die 208 is also electrically coupled to the bottom die 203 by means of a wire. Encapsulation material, such as resin 209, is located around the top die 208, the bottom die 203, the conductive wires, such as conductive wire 207, and over the upper surface of the substrate 201.

As previously described with respect to FIG. 1, due to intermittent faults caused by an insulation film, such as oxide (e.g., aluminum oxide), which easily grows on the die attachment pad 204, it is desired to destroy the oxide film, such that an electrical connection having a good performance is formed between the top die 208 and the pad 204. Studies show that, as compared to the over pad metallization technical solution in the prior art, the technical solution according to the embodiments of the present disclosure enables the formation of an electrical connection having a good performance between the top die 208 and the pad 204 without significantly increasing the manufacturing cost.

Studies show that stud bumps (e.g., stud bumps made from gold) can be soldered on the pad 204, and a thin oxidation layer on the surface of the pad 204 is destroyed using ultrasound energy, so as to implement the direct contact between the stud bumps 210 and the pad 204. The ultrasound energy causes the stud bumps 210 to rub against the thin oxidation layer on the surface of the pad, so as to destroy the oxidation layer and implement the direct contact between the stud bumps and the metal pad 204. Those skilled in the art will appreciate that ultrasound is merely an example, other technical means can be used to implement the direct connection between the stud bumps and the metal pad. For example, the pad 204 is manufactured and the stud bumps are applied in a vacuum environment or in a reductive atmosphere.

Figure 3:
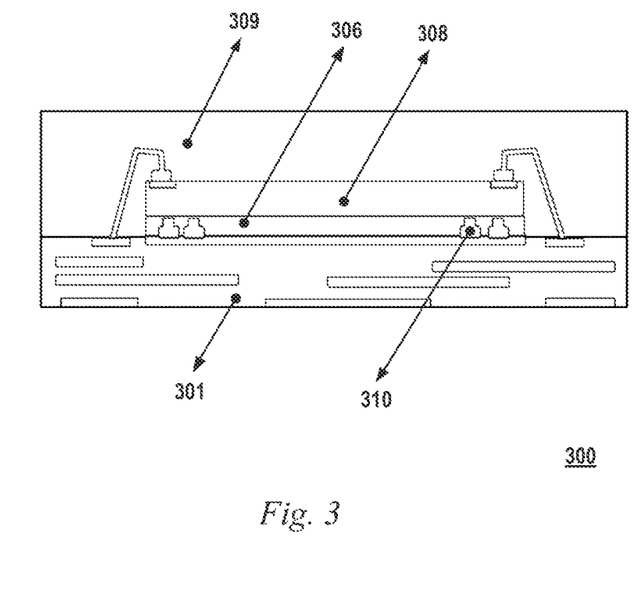
FIG. 3 is a schematic diagram of a semiconductor device according to another embodiment of the present disclosure.

FIG. 3 is another embodiment of the present disclosure. Like reference numerals refer to like components in FIG. 3 and FIG. 2, but are in the 300 series, rather than the 200 series, and will not be described again in the interest of brevity. In the example of FIG. 3, a bottom die is removed. In other words, in the embodiment of FIG. 3, the semiconductor device 300 only has one die, i.e., a die 308. However, those skilled in the art will appreciate that FIG. 3 is merely an example, there may be other arrangements, for example, 3 or more stacked semiconductor dies, wherein an electrical coupling mode between the dies is similar to the coupling mode previously described with respect to FIG. 2, which will not be described again.

In the example of FIG. 3, stud bumps 310 are directly provided on an aluminum pad on an upper surface of an organic substrate 301, and a conductive glue 306 is applied around the stud bumps 310, and the die 308 is then electrically coupled to a joining pad by means of the conductive glue. The die 308 may have some bond pads thereon and be electrically coupled to the organic substrate 301 by means of wires. In the organic substrate 301, there are some circuit components electrically coupled to the die 308. In the example of FIG. 3, a thin oxidation layer between the stud bumps 310 and the pad is also destroyed by means such as ultrasound, such that the stud bumps 310 are directly electrically coupled to the pad. Finally, the semiconductor device is sealed by resin. In addition, the stud bumps aid in keeping the die flat, reducing the inclination, and maintaining the thickness of the conductive glue 306. As such, the semiconductor device achieves the best performance.

Figure 4:
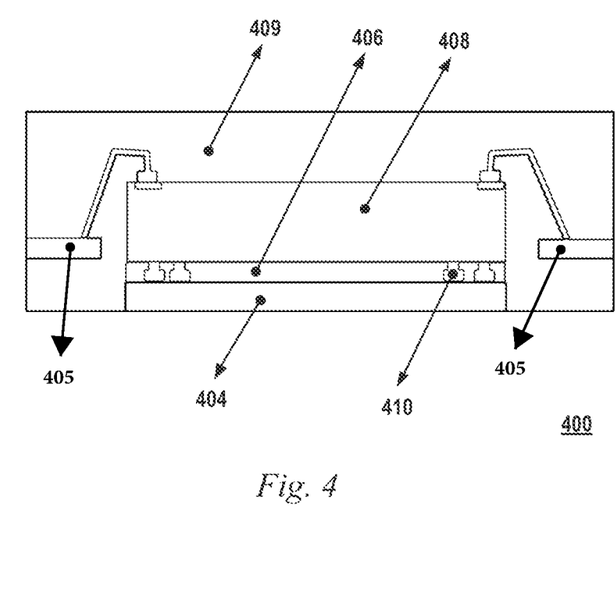
FIG. 4 is a schematic diagram of a semiconductor device according to a further embodiment of the present disclosure.

FIG. 4 shows a further example of the present disclosure, and like reference numerals refer to like components in FIG. 4 and FIG. 2, but are in the 400 series, rather than the 200 series, and will not be described again in the interest of brevity. In the example of FIG. 4, a die attachment pad 404 of a lead frame is provided along with leads 405. That is, the die pad of the lead frame forms the die attachment pad 404. The stud bumps 410 are provided on the attachment pad 404, and there is solder material or a conductive glue 406 around the stud bumps. A die 408 is located on the stud bumps 410 and the conductive glue 406 and is electrically coupled to the attachment pad 404 via the stud bumps 410 and the conductive glue 406. In the example of FIG. 4, an upper surface of the die 408 may have bond pads thereon and is electrically coupled to leads of the lead frame by wires. The semiconductor device 400 is sealed by an encapsulation material, such as resin 409. In addition, the stud bumps aid in keeping the die flat, reducing the inclination, and maintaining the thickness of the conductive glue 406. As such, the semiconductor device achieves the best performance. Although not shown, at least a portion of a lower surface of the leads may be exposed from the resin 409 as is known in the art.

The method for manufacturing a semiconductor device of the embodiments of the present disclosure is described below. In one embodiment of the present disclosure, a plurality of substrates or lead frames are provided in a matrix array form, and each of the plurality of substrates or lead frames is provided with a die joining material thereon and is joined to a bottom die by means of the joining material. A die attachment pad is provided on the bottom die; stud bumps are provided on the die attachment pad, and a conductive attachment material is provided on the die attachment pad around the stud bumps; and a top die is provided on the stud bumps and the conductive attachment material, such that the top die is joined to the conductive attachment material and the stud bumps. A wire bonding process is performed, and a thin oxidation film under the stud bumps is destroyed using ultrasound energy during the process. Resin is used for sealing, such as in a molding process. Finally, the wafer having a plurality of semiconductor devices is cut into individual semiconductor device chips or semiconductor packages.

Those skilled in the art will appreciate that the execution order of the method described above is merely exemplary and explanatory and is non-limiting, and there may also be other execution orders.

Figure 5:
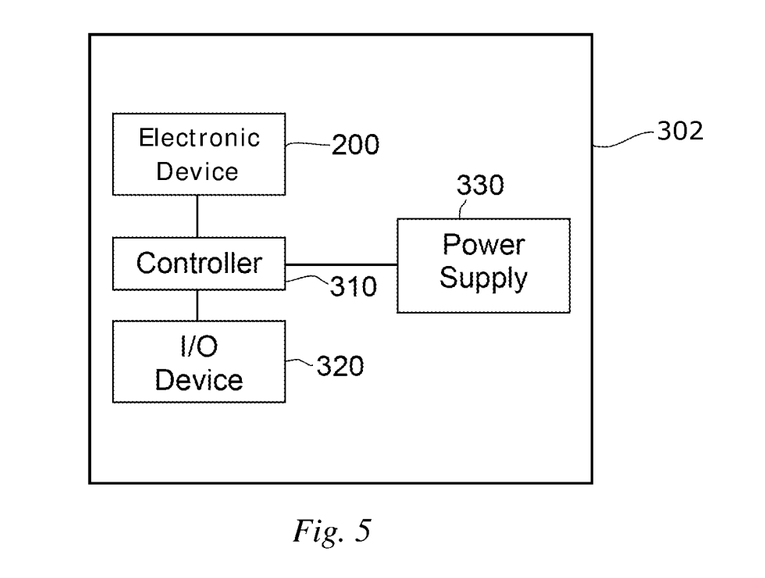
FIG. 5 is a block diagram of an electronic device according to an embodiment of the present disclosure.

FIG. 5 is block diagram of an electronic device that includes a semiconductor device 200, but may be any one of the semiconductor devices 200, 300, and 400. The electronic device may be a mobile communications apparatus, such as a mobile phone and a personal digital assistant, a laptop, a desktop computer, a camera or video device including a network video, a vehicle parking sensor, a wearable device, such as a smartwatch, or any other electronic device. The electronic device 302 includes a controller 310 and semiconductor device 200 that is electrically coupled to the controller. The controller 310 includes control circuitry, which may include one or more processors, memory, and discrete logic. The controller 310 is configured to transmit signal to and receive signals from the semiconductor device 200. The electronic device may further include an input/output device 320, for example, a keyboard or a display that is coupled to the controller. The electronic device may further include a power supply 330, which may be a battery or components for coupling to an external power source.

In general, according to a first aspect of the present disclosure, a semiconductor device is provided, comprising: a die attachment pad; a stud bump located on the die attachment pad and in direct contact with the die attachment pad; a first die located on the stud bump and electrically coupled to the stud bump; and a conductive attachment material located between the die attachment pad and the first die.

Optionally, the semiconductor device further comprises: a substrate, wherein the die attachment pad is located on the substrate.

Optionally, the semiconductor device further comprises: a second die, wherein the die attachment pad is located on the second die and electrically coupled to the second die.

Optionally, the semiconductor device further comprises: a substrate, wherein the second die is located on the substrate.

Optionally, the semiconductor device further comprises: resin, wherein the resin encapsulates the first die, the conductive attachment material and the substrate, or encapsulates the first die, the second die, the conductive attachment material and the substrate.

Optionally, the semiconductor device further comprises: a lead frame, wherein the die attachment pad is coupled to the lead frame.

Optionally, the semiconductor device further comprises: resin, wherein the resin encapsulates the first die, the conductive attachment material and the lead frame.

Optionally, the direct contact between the stud bump and the die attachment pad is implemented by means of ultrasound processing.

According to another aspect of the present disclosure, an electronic apparatus is provided, comprising the semiconductor device as described in any one of the above.

According to a further aspect of the present disclosure, a method for manufacturing a semiconductor device is provided, comprising: providing a die attachment pad; providing a stud bump on the die attachment pad, such that the die attachment pad is in direct contact with the stud bump; providing a conductive attachment material on the die attachment pad; and providing a first die on the stud bump and the conductive attachment material.

Optionally, providing the die attachment pad comprises: providing the die attachment pad on a substrate.

Optionally, providing the die attachment pad comprises: providing the die attachment pad on a second die, such that the die attachment pad is electrically coupled to the second die.

Optionally, the method further comprises: providing a substrate, such that the second die is located on the substrate.

Optionally, the method further comprises: encapsulating the first die, the conductive attachment material and the substrate, or encapsulating the first die, the second die, the conductive attachment material and the substrate using resin.

Optionally, the method further comprises: providing a lead frame, such that the die attachment pad is coupled to the lead frame.

Optionally, the method further comprises: encapsulating the first die, the conductive attachment material and the lead frame using resin.

Optionally, the semiconductor device is processed using ultrasound, such that at least a portion of a metal oxide layer on a surface of the die attachment pad is removed so as to implement the direct contact between the die attachment pad and the stud bump.

In addition, even though the operations of the method in the embodiments of the present disclosure are described in a specific order in the figures, this is not intended to require or imply that these operations must be executed in the specific order, or that the desired result can only be realized by executing all the operations shown. Instead, the execution order of the steps depicted in the flow charts can be changed. Additionally or alternatively, some steps can be omitted, a plurality of steps can be incorporated as one step for execution, and/or one step can be subdivided into a plurality of steps for execution.

Although the embodiments of the present disclosure have been described with reference to several detailed embodiments, it should be appreciated that the embodiments of the present disclosure are not limited to the disclosed detailed embodiments. The present disclosure intends to cover various modifications and equivalent arrangements within the spirit and scope of the appended claims. The scope of the appended claims conforms to the broadest interpretation, thereby including all such modifications and equivalent structures and functions.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A semiconductor device, comprising:
   a single continuous die attachment pad;
   a plurality of conductive stud bumps on the die attachment pad and in direct physical contact with the die attachment pad without any intermediate layer, the plurality of conductive stud bumps being rigid bodies, the plurality of conductive stud bumps being separated from each other;
   a first die located on the plurality of conductive stud bumps and electrically coupled to the plurality of conductive stud bumps; and
   a conductive attachment material located between the die attachment pad and the first die, the conductive attachment material at side surfaces of the plurality of conductive stud bumps, wherein the conductive attachment material is electrically coupled to the plurality of conductive stud bumps.

2. The semiconductor device as claimed in claim 1, further comprising:
   a substrate, wherein the die attachment pad is located on the substrate.

3. The semiconductor device as claimed in claim 2, further comprising:
   resin, wherein the resin encapsulates the first die, the conductive attachment material and at least a portion of an upper surface of the substrate.

4. The semiconductor device as claimed in claim 1, further comprising:
   a second die, wherein the die attachment pad is located on the second die and electrically coupled to the second die.

5. The semiconductor device as claimed in claim 4, further comprising:
   a substrate, wherein the second die is located on the substrate.

6. The semiconductor device as claimed in claim 1, further comprising:
   a lead frame, wherein the die attachment pad is a die pad of the lead frame; and
   resin, wherein the resin encapsulates the first die, the conductive attachment material and at least a portion of the die pad of the lead frame.

7. The semiconductor device as claimed in claim 1 wherein the conductive attachment material is located around side surfaces of the plurality of stud bumps between the die attachment pad and the first die.

8. The semiconductor device of claim 1, further comprising:
   a layer on the die attachment pad, the plurality of conductive stud bumps penetrating the layer to form the direct physical contact with the die attachment pad.

9. The semiconductor device of claim 8, wherein the plurality of conductive stud bumps are configured to remove a portion of the layer by rubbing the portion of the layer in response to being exposed to ultrasound processing.

10. The semiconductor device of claim 8, wherein the layer is an oxidation layer.

11. An electronic apparatus, comprising:
    a semiconductor package including:
        a single continuous die attachment pad;
        a layer on the die attachment pad;
        a first semiconductor die having a first surface and a second surface, the first surface including a bond pad, the second surface coupled to the die attachment pad;
        a plurality of conductive stud bumps having first ends coupled to the die attachment pad and second ends coupled to the first semiconductor die, the plurality of conductive stud bumps penetrating the layer and in immediate direct contact with the die attachment pad, the plurality of conductive stud bumps being separated from each other; and
        a conductive attachment material located between the die attachment pad and the first semiconductor die and around the plurality of conductive stud bumps, the conductive attachment material electrically coupled to the plurality of conductive stud bumps.

12. The electronic device as claimed in claim 11, wherein each of the plurality of conductive stud bumps is made from gold or a gold alloy.

13. The electronic device as claimed in claim 11, wherein the die attachment pad is a die pad of a lead frame.

14. The electronic device as claimed in claim 11, wherein the die attachment pad is a pad formed on a substrate or a pad formed on a second semiconductor die.

15. A method for manufacturing a semiconductor device, comprising:
    forming a plurality of conductive stud bumps on a single continuous die attachment pad, wherein forming the plurality of conductive stud bumps includes removing portions of a layer on the die attachment pad so that the plurality of conductive stud bumps are in direct physical contact with the die attachment pad without the layer therebetween, the plurality of conductive stud bumps being separated from each other;
    coupling a first die on the plurality of conductive stud bumps, the first die electrically coupled to the plurality of conductive stud bumps; and providing a conductive attachment material between the die attachment pad and the first die and at side surfaces of the plurality of conductive stud bumps, the conductive attachment material electrically coupled to the plurality of conductive stud bumps.

16. The method as claimed in claim 15, wherein the die attachment pad is a die attachment pad of a substrate, and wherein the layer on the die attachment pad is an oxide layer.

17. The method as claimed in claim 15, wherein the die attachment pad is on a second die, and wherein the die attachment pad is electrically coupled to one or more integrated circuits in the second die.

18. The method as claimed in claim 17, further comprising coupling the second die to a substrate and encapsulating the first die, the conductive attachment material and the second die with resin.

19. The method as claimed in claim 15, wherein the die attachment pad is a die attachment pad of a lead frame.

20. The method as claimed in claim 19, further comprising encapsulating the first die, the conductive attachment material and the lead frame using resin.

\* \* \* \* \*